US009046554B2

(12) United States Patent
Nomura et al.

(10) Patent No.: US 9,046,554 B2
(45) Date of Patent: Jun. 2, 2015

(54) CURRENT SENSOR

(71) Applicant: ALPS GREEN DEVICES CO., LTD., Tokyo (JP)

(72) Inventors: Masatoshi Nomura, Miyagi-ken (JP); Manabu Tamura, Miyagi-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 372 days.

(21) Appl. No.: 13/766,664

(22) Filed: Feb. 13, 2013

(65) Prior Publication Data

US 2013/0154630 A1 Jun. 20, 2013

Related U.S. Application Data

(63) Continuation of application No. PCT/JP2011/066808, filed on Jul. 25, 2011.

(30) Foreign Application Priority Data

Aug. 31, 2010 (JP) ................. 2010-194174

(51) Int. Cl.
- G01R 33/09 (2006.01)
- G01R 27/02 (2006.01)
- G01R 19/257 (2006.01)
- G01R 15/20 (2006.01)

(52) U.S. Cl.
CPC ............ *G01R 19/257* (2013.01); *G01R 15/207* (2013.01)

(58) Field of Classification Search
USPC ........................................................ 324/252
See application file for complete search history.

(56) References Cited

U.S. PATENT DOCUMENTS

| 6,636,029 | B1 | 10/2003 | Kunze et al. |
| 2003/0122535 | A1 | 7/2003 | Williams et al. |
| 2008/0258721 | A1 | 10/2008 | Guo et al. |
| 2009/0184704 | A1 | 7/2009 | Guo et al. |
| 2009/0201018 | A1 | 8/2009 | Guo et al. |

FOREIGN PATENT DOCUMENTS

| JP | 2007-78374 | 3/2007 |
| JP | 2010-139244 | 6/2010 |
| WO | 2008/047428 | 4/2008 |

OTHER PUBLICATIONS

Search Report dated Oct. 25, 2011 from International Application No. PCT/JP2011/066808.

*Primary Examiner* — Bot Ledynh
(74) *Attorney, Agent, or Firm* — Beyer Law Group LLP

(57) ABSTRACT

A current sensor includes: a first magnetic sensor and a second magnetic sensor; a first analog-to-digital converter which is connected to the first magnetic sensor and converts an output signal of the first magnetic sensor from an analog signal to a digital signal so as to be output; a second analog-to-digital converter which is connected to the second magnetic sensor and converts an output signal of the second magnetic sensor from an analog signal to a digital signal so as to be output; and an operation device which is connected to the first analog-to-digital converter and the second analog-to-digital converter, and outputs an operation value by subjecting the output signal of the first analog-to-digital converter and the output signal of the second analog-to-digital converter to differential operation.

18 Claims, 6 Drawing Sheets

CURRENT SENSOR

CLAIM OF PRIORITY

This application is a Continuation of international Application No. PCT/JP2011/066808 filed on Jul. 25, 2011, which claims benefit of Japanese Patent Application No. 2010-194174 filed on Aug. 31, 2010. The entire contents of each application noted above are hereby incorporated by reference.

BACKGROUND OF THE INVENTION

1. Field of the Invention

The present invention relates to a current sensor that measures the magnitude of current. Particularly, the present invention relates to a current sensor in which degradation in measurement accuracy is suppressed.

2. Description of the Related Art

In fields such as a motor driving technique in an electric vehicle or a hybrid vehicle, relatively high current is involved, and for this application, a current sensor capable of contactlessly measuring a high current is required. In addition, as the current sensor, a current sensor having a method of detecting a change in magnetic field caused by a current to be measured using a magnetic sensor is used in practice. In addition, the current sensor using the magnetic sensor has a problem of degradation in measurement accuracy due to an effect of a disturbance magnetic field, and thus methods of suppressing this are suggested.

As the method of suppressing degradation in measurement accuracy due to an effect of a disturbance magnetic field, for example, a configuration in which a differential in output signals of two magnetic sensors is acquired is suggested (for example, refer to U.S. Pat. No. 6,642,705). In this configuration, in the output signals of the two magnetic sensors, an effect of a magnetic field formed by a current to be measured is expressed as a reversed phase, and the effect of the disturbance magnetic field is expressed as the same phase. Therefore, by acquiring the differential, the effect of the disturbance magnetic field may be removed. In addition, since the output signals of the magnetic sensors are analog signals, in the corresponding method, all correction processes including differential operation are performed on the basis of the analog signals.

On the other hand, a method of performing partial processes on the basis of digital signals other than performing all correction processes on the basis of analog signals is suggested (for example, see Pamphlet of International Publication WO 2008/047428). In this method, after acquiring a differential with a differential amplifier, an analog differential value is converted into a digital signal using an analog-to-digital converter, and the subsequent processes are performed.

As described above, in the case where all the correction processes are performed using analog signals, an adjustment scheme such as adjustment of variable resistance or laser trimming for resistances needs to be used in order to enhance the correction accuracy. However, this scheme is only a one-time scheme, and re-adjustment is difficult. In addition, this scheme is disadvantageous in terms of cost. On the other hand, in the method described in Pamphlet of International Publication WO 2008/047428, such problems may be solved to some extent. However, there is a problem in that appropriate correction is difficult in a case where noise is left in the analog differential value and the like.

SUMMARY OF THE INVENTION

The present invention provides a current sensor capable of enabling an appropriate correction process, thereby suppressing degradation in measurement accuracy.

According to an aspect of the present invention, there is provided a current sensor including: a first magnetic sensor and a second magnetic sensor which are arranged in a periphery of a current line through which a current to be measured passes and output reversed output signals due to an induction magnetic field from the current to be measured; a first analog-to-digital converter which is connected to the first magnetic sensor and converts the output signal of the first magnetic sensor from an analog signal to a digital signal so as to be output; a second analog-to-digital converter which is connected to the second magnetic sensor and converts the output signal of the second magnetic sensor from an analog signal to a digital signal so as to be output; and an operation device which is connected to the first analog-to-digital converter and the second analog-to-digital converter, and outputs an operation value by subjecting the output signal of the first analog-to-digital converter and the output signal of the second analog-to-digital converter to differential operation, wherein the operation device determines that measurement accuracy is low in a case where a difference between a variation $\Delta_1$ in an output signal $O_{1\text{-}2}$ of the first analog-to-digital converter in second sampling immediately after first sampling with respect to an output signal $O_{1\text{-}1}$ of the first analog-to-digital converter in the first sampling and a variation $\Delta_2$ in an output signal $O_{2\text{-}2}$ of the second analog-to-digital converter in the second sampling with respect to an output signal $O_{2\text{-}1}$ of the second analog-to-digital converter in the first sampling is higher than a threshold $\Delta_{th}$.

In the current sensor in the aspect of the present invention, in a case where it is determined that the measurement accuracy is low, an operation value in the first sampling may be output as an operation value in the second sampling.

In the current sensor in the aspect of the present invention, in a case where it is determined that the measurement accuracy is low, an error signal may be output.

In the current sensor in the aspect of the present invention, in a case where it is determined that the measurement accuracy is low, the operation device may output a value calculated from a value obtained by multiplying a differential value between the output signal $O_{1\text{-}2}$ of the first analog-to-digital converter and the output signal $O_{2\text{-}2}$ of the second analog-to-digital converter by a coefficient of less than 1 during the second sampling, as an operation value in the second sampling.

In the current sensor in the aspect of the present invention, the first magnetic sensor and the second magnetic sensor may be arranged to have point symmetry about the current line as a center and may be arranged to have the same sensing axis direction.

In the current sensor in the aspect of the present invention, the first magnetic sensor and the second magnetic sensor may be magnetic balance type sensors which each include a magnetic sensor element having characteristics being changed due to the induction magnetic field from the current to be measured and a feedback coil which generates a cancellation magnetic field that cancels the induction magnetic field.

In the current sensor in the aspect of the present invention, the magnetic sensor element may be a magnetoresistance element.

According to another aspect of the present invention, there is provided a current sensor including: a first magnetic sensor and a second magnetic sensor which are arranged in a periphery of a current line through which a current to be measured passes and output reversed output signals due to an induction magnetic field from the current to be measured; a first analog-to-digital converter which is connected to the first magnetic sensor and converts the output signal of the first magnetic sensor from an analog signal to a digital signal so as to be output; a second analog-to-digital converter which is connected to the second magnetic sensor and converts the output signal of the second magnetic sensor from an analog signal to a digital signal so as to be output; and an operation device which is connected to the first analog-to-digital converter and the second analog-to-digital converter, and outputs an operation value by subjecting the output signal of the first analog-to-digital converter and the output signal of the second analog-to-digital converter to differential operation, wherein the operation device determines that measurement accuracy is low, in a case where a variation $\Delta_1$ in an output signal $O_{1\text{-}2}$ of the first analog-to-digital converter in second sampling immediately after first sampling with respect to an output signal $O_{1\text{-}1}$ of the first analog-to-digital converter in the first sampling is higher than a threshold $\Delta_{th}$ and a variation $\Delta_2$ in an output signal $O_{2\text{-}2}$ of the second analog-to-digital converter in the second sampling with respect to an output signal $O_{2\text{-}1}$ of the second analog-to-digital converter in the first sampling is higher than the threshold $\Delta_{th}$.

In the current sensor in the aspect of the present invention, in a case where it is determined that the measurement accuracy is low, an operation value in the first sampling may be output as an operation value in the second sampling.

In the current sensor in the aspect of the present invention, in a case where it is determined that the measurement accuracy is low, an error signal may be output.

In the current sensor in the aspect of the present invention, in a case where it is determined that the measurement accuracy is low, the operation device may output a value calculated from a value obtained by multiplying a differential value between the output signal $O_{1\text{-}2}$ of the first analog-to-digital converter and the output signal $O_{2\text{-}2}$ of the second analog-to-digital converter by a coefficient of less than 1 during the second sampling, as an operation value in the second sampling.

In the current sensor in the aspect of the present invention, the first magnetic sensor and the second magnetic sensor may be arranged to have point symmetry about the current line as a center and may be arranged to have the same sensing axis direction.

In the current sensor in the aspect of the present invention, the first magnetic sensor and the second magnetic sensor may be magnetic balance type sensors which each include a magnetic sensor element having characteristics being changed due to the induction magnetic field from the current to be measured and a feedback coil which generates a cancellation magnetic field that cancels the induction magnetic field.

In the current sensor in the aspect of the present invention, the magnetic sensor element may be a magnetoresistance element.

According to another aspect of the present invention, there is provided a current sensor including: a first magnetic sensor and a second magnetic sensor which are arranged in a periphery of a current line through which a current to be measured passes and output reversed output signals due to an induction magnetic field from the current to be measured; a first analog-to-digital converter which is connected to the first magnetic sensor and converts the output signal of the first magnetic sensor from an analog signal to a digital signal so as to be output; a second analog-to-digital converter which is connected to the second magnetic sensor and converts the output signal of the second magnetic sensor from an analog signal to a digital signal so as to be output; and an operation device which is connected to the first analog-to-digital converter and the second analog-to-digital converter, and outputs an operation value by subjecting the output signal of the first analog-to-digital converter and the output signal of the second analog-to-digital converter to differential operation, wherein the operation device outputs, in a case where a variation $\Delta_1$ in an output signal $O_{1\text{-}2}$ of the first analog-to-digital converter in second sampling immediately after first sampling with respect to an output signal $O_{1\text{-}1}$ of the first analog-to-digital converter in the first sampling is higher than a threshold $\Delta_{th}$ and a variation $\Delta_2$ in an output signal $O_{2\text{-}2}$ of the second analog-to-digital converter in the second sampling with respect to an output signal $O_{2\text{-}1}$ of the second analog-to-digital converter in the first sampling is not higher than the threshold $\Delta_{th}$, a value calculated from the output signal $O_{2\text{-}2}$ of the second analog-to-digital converter during the second sampling as an operation value in the second sampling, and the operation device outputs, in a case where the variation $\Delta_1$ in the output signal $O_{1\text{-}2}$ of the first analog-to-digital converter in the second sampling with respect to the output signal $O_{1\text{-}1}$ of the first analog-to-digital converter in the first sampling is not higher than the threshold $\Delta_{th}$ and the variation $\Delta_2$ in the output signal $O_{2\text{-}2}$ of the second analog-to-digital converter in the second sampling with respect to the output signal $O_{2\text{-}1}$ of the second analog-to-digital converter in the first sampling is higher than the threshold $\Delta_{th}$, a value calculated from the output signal $O_{1\text{-}2}$ of the first analog-to-digital converter during the second sampling as an operation value in the second sampling.

In the current sensor in the aspect of the present invention, the first magnetic sensor and the second magnetic sensor may be arranged to have point symmetry about the current line as a center and may be arranged to have the same sensing axis direction.

In the current sensor in the aspect of the present invention, the first magnetic sensor and the second magnetic sensor may be magnetic balance type sensors which each include a magnetic sensor element having characteristics being changed due to the induction magnetic field from the current to be measured and a feedback coil which generates a cancellation magnetic field that cancels the induction magnetic field.

In the current sensor in the aspect of the present invention, the magnetic sensor element may be a magnetoresistance element.

In this configuration, the output signal of the first magnetic sensor and the output signal of the second magnetic sensor may be converted into individual digital signals. That is, in a state where information autonomously included by the output signal of the first magnetic sensor and information autonomously included by the output signal of the second magnetic sensor are left, the subsequent correction process (operation process) is performed. Therefore, the information autonomously included by the output signal of the first magnetic sensor and the information autonomously included by the output signal of the second magnetic sensor may be used for the correction process. Therefore, compared to a case where analog differential values from the output signal of the first magnetic sensor and the output signal of the second magnetic sensor are converted into digital signals, more appropriate correction is possible. Accordingly, degradation in current measurement accuracy may be effectively suppressed.

In the specification, the term "current line" only represents a constituent element capable of guiding currents and is not used for the intent to limit the shape to a line shape. For example, the "current line" includes a plate-shaped conductive member, a conductive member having a thin-film shape, and the like.

In this configuration, an effect of an external magnetic field may be easily canceled by the differential operation.

In this configuration, the current sensor having fast response speed and low temperature dependence may be easily realized.

In this configuration, sufficient current measurement accuracy may be ensured by the magnetoresistance element.

In this configuration, the variation $\Delta_1$ in the output signal of the first analog-to-digital converter and the variation $\Delta_2$ in the output signal of the second analog-to-digital converter are compared to each other, and in the case where a deviation therebetween is high, it is assumed that the measurement accuracy is in a low state and the new measurement data is discarded. Accordingly, degradation in the measurement accuracy may be suppressed.

In this configuration, in a case where both the output signal of the first analog-to-digital converter and the output signal of the second analog-to-digital converter significantly change, it is assumed that the measurement accuracy is in a low state and the new measurement data is discarded. Accordingly, degradation in the measurement accuracy may be suppressed.

In this configuration, malfunction and the like of the system may be prevented.

In this configuration, the variation in the output signal of the first analog-to-digital converter and the variation in the output signal of the second analog-to-digital converter are compared to each other, and in the case where a deviation therebetween is high, it is assumed that the measurement accuracy is in a low state and the weighting of the new measurement data is reduced. Accordingly, degradation in the measurement accuracy may be suppressed.

In this configuration, in a case where both the output signal of the first analog-to-digital converter and the output signal of the second analog-to-digital converter significantly change, it is assumed that the measurement accuracy is in a low state and the weighting of the new measurement data is reduced. Accordingly, degradation in the measurement accuracy may be suppressed.

In this configuration, malfunction and the like of the system may be prevented.

In this configuration, in a case where any of the output signal of the first analog-to-digital converter and the output signal of the second analog-to-digital converter significantly changes, the significantly changed output signal is assumed to be in a state where the measurement accuracy is low and thus the significantly changed output signal is discharged, and the variation in the output signal that does not significantly change is employed. Accordingly, degradation in the measurement accuracy may be suppressed.

In the current sensor according to the aspects of the present invention, since the output signal of the first magnetic sensor and the output signal of the second magnetic sensor are able to be converted into individual digital signals, more appropriate correction is possible compared to a case where differential values between the output signal of the first magnetic sensor and the output signal of the second magnetic sensor are converted into digital signals for use and the like. Therefore, degradation in the current measurement accuracy may be effectively suppressed.

DESCRIPTION OF THE PREFERRED EMBODIMENTS

The inventors found that more appropriate correction is achieved by, other than directly connecting a first magnetic sensor and a second magnetic sensor which output reversed output signals to a differential amplifier, connecting an analog-to-digital converter to each of the first magnetic sensor and the second magnetic sensor. This is because, by performing a conversion from an analog signal to a digital signal in a stage prior to a correction process (operation process) such as differential value calculation, information autonomously included by the output signal of the first magnetic sensor and information autonomously included by the output signal of the second magnetic sensor are left for use.

That is, the gist of the present invention is to enable more appropriate correction using the information autonomously included by the output signal of the first magnetic sensor and the information autonomously included by the output signal of the second magnetic sensor by performing the conversion from an analog signal to a digital signal in a stage prior to the correction process (operation process) such as differential value calculation. This may be rephrased as providing an analog-to-digital converter on the upstream side of an operation device (the upstream side of the flow of processes). Hereinafter, an embodiment of the present invention will be described in detail with reference to the drawings.

Figure 1:
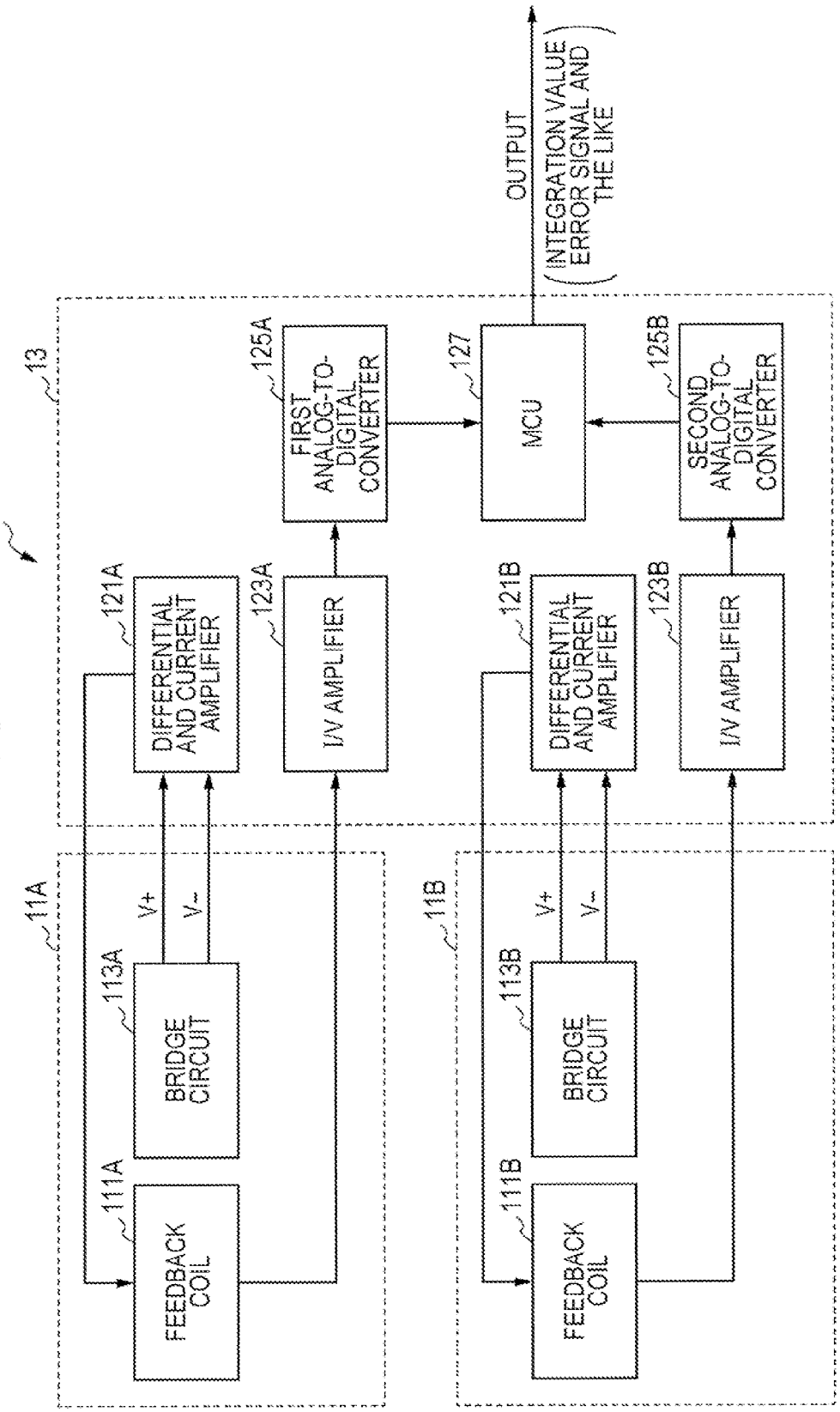
FIG. 1 is a schematic diagram illustrating a configuration example of a current sensor according to the present invention.

FIG. 1 is an example of a block diagram of a current sensor 1 according to the present invention. The current sensor 1 illustrated in FIG. 1 has a first magnetic sensor 11A, a second magnetic sensor 11B, and a control unit 13 which controls the first magnetic sensor 11A and the second magnetic sensor 11B.

The first magnetic sensor 11A is a magnetic balance type sensor and is constituted by a feedback coil 111A disposed to be able to generate a magnetic field in a direction in which a magnetic field generated by current to be measured is canceled, and a bridge circuit 113A which includes two magnetoresistance elements that are magnetic detection elements and two fixed resistance elements. In addition, the second magnetic sensor 11B is, as in the first magnetic sensor 11A, also constituted by a feedback coil 111B disposed to be able to generate a magnetic field in a direction in which a magnetic field generated by current to be measured is canceled, and a bridge circuit 113B which includes two magnetoresistance elements that are magnetic detection elements and two fixed resistance elements. In addition, even though the magnetic balance type sensor is used herein, a magnetic proportion type sensor may also be used.

The control unit 13 includes a differential and current amplifier 121A which amplifies differential outputs of the bridge circuit 113A of the first magnetic sensor 11A and controls a feedback current of the feedback coil 111A, an I/V amplifier 123A which converts the feedback current of the first magnetic sensor 11A to a voltage, and a first analog-to-digital converter (A/D converter) 125A which converts an output of the I/V amplifier 123A to a digital signal. In addition, the control unit 13 includes a differential and current amplifier 121B which amplifies differential outputs of the bridge circuit 113B of the second magnetic sensor 11B and controls a feedback current of the feedback coil 111B, an I/V amplifier 123B which converts the feedback current of the second magnetic sensor 11B to a voltage, and a second analog-to-digital converter (A/D converter) 125B which converts an output of the I/V amplifier 123B to a digital signal. In addition, the control unit 13 includes an MCU (Micro Controller Unit) 127 connected to the first analog-to-digital converter 125A and the second analog-to-digital converter 125B as an operation device that performs various processes such as differential operation.

The feedback coils 111A and 111B are respectively disposed near the magnetoresistance elements of the bridge circuits 113A and 113B and generate cancellation magnetic fields that cancel induction magnetic fields generated by the current to be measured. GMR (Giant Magneto Resistance) elements, TMR (Tunnel Magneto Resistance) elements, and the like may be used as the magnetoresistance elements of the bridge circuits 113A and 113B. The magnetoresistance element has characteristics of varying in resistance due to application of the induction magnetic field caused by the current to be measured. Each of the bridge circuits 113A and 113B is constituted by using the two magnetoresistance elements and the two fixed resistance elements having such characteristics, thereby realizing a current sensor with high sensitivity. In addition, by using the magnetoresistance element, the sensing axis is easily disposed in a direction parallel to a substrate surface on which the current sensor is installed, enabling a planar coil to be used.

Each of the bridge circuits 113A and 113B has two output terminals that cause a voltage difference due to the induction magnetic field caused by the current to be measured. Two outputs from the two output terminals of each of the bridge circuits 113A and 113B are subjected to differential amplification by the differential and current amplifiers 121A and 121B, and the outputs subjected to differential amplification are provided as currents (feedback currents) to the feedback coils 111A and 111B. The feedback currents correspond to voltage differences due to the induction magnetic fields. When the feedback currents are provided to the feedback coils 111A and 111B, cancellation magnetic fields that cancel the induction magnetic fields are generated by the corresponding feedback currents. In addition, currents that flow through the feedback coils 111A and 111B when a balanced state in which the induction magnetic fields and the cancellation magnetic fields cancel each other is achieved are converted into voltages by the I/V amplifiers 123A and 123B to be sensor outputs.

In the differential and current amplifiers 121A and 121B, by setting a power supply voltage to a value close to a value of the reference voltage for I/V conversion+(the maximum value of the rating of the feedback coil resistance×the feedback coil current at full scale), the feedback current is restricted, achieving an effect of protection of the magnetoresistance elements and the feedback coil. Here, the differential between the two outputs of each of the bridge circuits 113A and 113B is amplified to be used as the feedback current. Alternatively, only midpoint potentials may be output from the bridge circuits 113A and 113B, and feedback currents based on potential differences from a predetermined reference potential may be used.

The first analog-to-digital converter 125A and the second analog-to-digital converter 125B convert the outputs of the first magnetic sensor 11A and the second magnetic sensor 11B which are analog signals into digital signals to be output. As the conversion method, there are a parallel comparison type, a sequential comparison type, a double integral type, a pipeline type, a delta-sigma type, and the like, and these may be appropriately selected depending on the required accuracy and response speed.

The MCU 127 receives the digital signals from the first analog-to-digital converter 125A and the second analog-to-digital converter 125B, and compares the outputs of the first analog-to-digital converter 125A and the second analog-to-digital converter 125B at a certain timing to the outputs of the first analog-to-digital converter 125A and the second analog-to-digital converter 125B at the preceding timing. In addition, in a case where both the outputs of the two analog-to-digital converters significantly change in the same phase or in a case where the output of only one analog-to-digital converter significantly changes, a state having low measurement accuracy is determined, and the measurement data is discarded or is provided with a low weighting. This determination is performed because output changes caused by current changes are represented as changes of reversed phases and are not represented as changes of the same phase or a change in only one output.

More specifically, the MCU 127 performs (1) a correction process of comparing a variation $\Delta_1$ in the output signal of the first analog-to-digital converter 125A to a variation $\Delta_2$ in the output signal of the second analog-to-digital converter 125B, and in a case where the difference therebetween is greater than a threshold $\Delta_{th}$, discarding the measurement data and using data acquired at the preceding timing, (2) a correction process of, in a case where a variation $\Delta_1$ in the output of the first analog-to-digital converter 125A and a variation $\Delta_2$ in the output of the second analog-to-digital converter 125B have the same sign and each of the absolute value of $\Delta_1$ and the absolute value of $\Delta_2$ is greater than a threshold $\Delta_{th}$ determined in advance, discarding the measurement data and using data acquired at the preceding timing, (3) a correction process of comparing a variation $\Delta_1$ in the output signal of the first analog-to-digital converter 125A to a variation $\Delta_2$ in the output signal of the second analog-to-digital converter 125B, and in a case where the difference therebetween is greater than a threshold $\Delta_{th}$, reducing the weighting of the measurement data, (4) a correction process of, in a case where a variation $\Delta_1$ in the output of the first analog-to-digital converter 125A and a variation $\Delta_2$ in the output of the second analog-to-digital converter 125B have the same sign and each of the absolute value of $\Delta_1$ and the absolute value of $\Delta_2$ is greater than a threshold $\Delta_{th}$ determined in advance, reducing the weighting of the measurement data, and the like.

In addition, there may be cases where the MCU 127 performs (5) a correction process of, in a case where any one of the absolute value of a variation $\Delta_1$ in the output of the first analog-to-digital converter 125A and the absolute value of a variation $\Delta_2$ in the output of the second analog-to-digital converter 125B is greater than a threshold $\Delta_{th}$ determined in advance, discarding the one value of measurement data. Besides, the MCU 127 may also be configured to perform operation processes such as acquisition of a differential value and correction of the gain of a differential value and an offset.

As described above, in the current sensor 1 in this embodiment, the output signal of the first magnetic sensor 11A and the output signal of the second magnetic sensor 11B may be converted into individual digital signals by the first analog-to-digital converter 125A and the second analog-to-digital converter 125B. That is, in a case where information autonomously included by the output signal of the first magnetic sensor 11A and information autonomously included by the output signal of the second magnetic sensor 11B are left, the subsequent correction process (operation process) is performed, and thus the information autonomously included by the output signal of the first magnetic sensor 11A and the information autonomously included by the output signal of the second magnetic sensor 11B may be used in the correction process. Therefore, compared to a case where an analog differential value between the output signal of the first magnetic sensor 11A and the output signal of the second magnetic sensor 11B is converted into a digital signal, more appropriate correction is possible. Accordingly, degradation in the current measurement accuracy may be effectively suppressed.

The configuration of the current sensor 1 according to the block diagram of FIG. 1 is only an example, and it is natural that other configurations may also be employed.

First Embodiment

In this embodiment, an example of the correction processes of the current sensor 1 will be described. Here, (1) the above-mentioned correction process of comparing a variation $\Delta_1$ in the output signal of the first analog-to-digital converter to a variation $\Delta_2$ in the output signal of the second analog-to-digital converter, and in a case where the difference therebetween is greater than a threshold $\Delta_{th}$, discarding the measurement data and using data acquired at the preceding timing will be described in detail.

Figure 2:
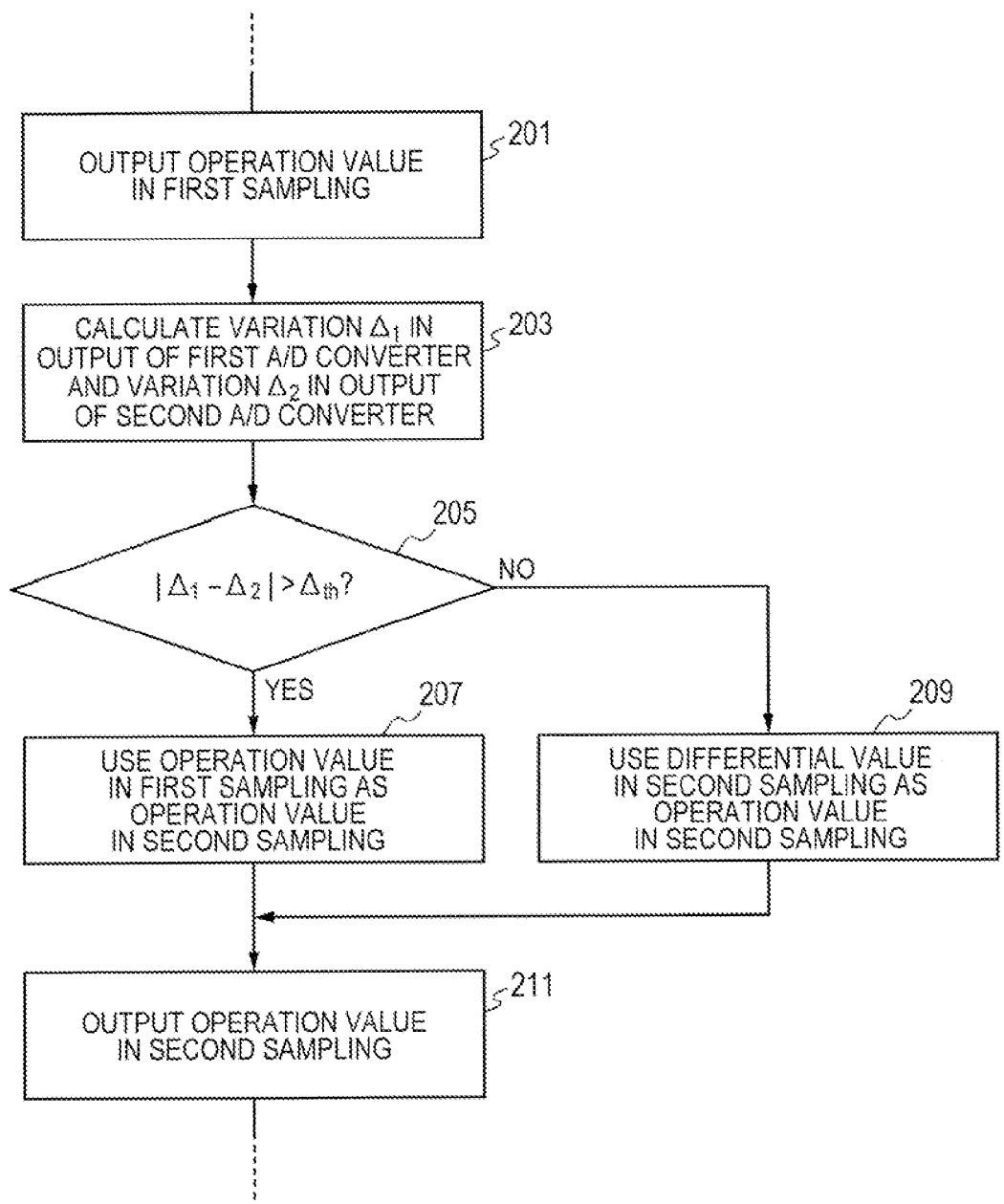
FIG. 2 is a diagram illustrating an example of a process flow in an operation device.

FIG. 2 is a diagram illustrating an example of a process flow in the MCU 127 of the current sensor 1. In the following description, first sampling is referred to as acquisition of measurement data at a certain timing and processing of the acquired measurement data in a case where current measurement is performed at a predetermined sampling cycle, and second sampling is referred to as acquisition of measurement data and processing of the acquired measurement data at the next timing after the first sampling. That is, ordinal numerals of the first sampling and the second sampling only represent measurements and processing that are continuously performed, and do not represent measurement and processing at specific timings. In addition, in FIG. 2, for simplifying the description, only characteristic processes of the current sensor 1 of the present invention are illustrated. In addition, the first sampling and the second sampling may be identically performed, and thus hereinafter, the second sampling is mainly described.

In Step 201, the MCU 127 outputs an operation value in the first sampling. In a case where noise of an output signal $O_{1-1}$ of the first analog-to-digital converter 125A connected to the first magnetic sensor 11A during the first sampling and an output signal $O_{1-2}$ of the second analog-to-digital converter 125B connected to the second magnetic sensor 11B during the first sampling is low, typically, a differential value therebetween ($O_{1-1}-O_{2-1}$ or $O_{2-1}-O_{1-1}$) is output as an operation value. Thereafter, the second sampling is started, and from the first analog-to-digital converter 125A and the second analog-to-digital converter 125B, the output signal (the output signal $O_{1-2}$ of the analog-to-digital converter 125A connected to the first magnetic sensor 11A during the second sampling) of the first magnetic sensor 11A converted into the digital signal, and the output signal (the output signal $O_{2-2}$ of the analog-to-digital converter 125B connected to the second magnetic sensor 11B during the second sampling) of the second magnetic sensor 11B converted into the digital signal are input to the MCU 127.

When the output signal $O_{1-2}$ and the output signal $O_{2-2}$ are input to the MCU 127, the MCU 127 calculates a variation $\Delta_1$ in the output of the first analog-to-digital converter 125A and a variation $\Delta_2$ in the output of the second analog-to-digital converter 125B on the basis of the output signals $O_{1-2}$ and $O_{2-2}$ and the output signals $O_{1-1}$ and $O_{1-2}$ that have already been acquired during the first sampling in Step 203. That is, $\Delta_1=O_{1-2}-O_{1-1}$, and $\Delta_2=O_{2-2}-O_{2-1}$ are obtained.

In Step 205, in order to determine whether noise in the output signal of the first magnetic sensor 11A and the output signal of the second magnetic sensor 11B is high or low, it is determined whether or not the difference between the variation $\Delta_1$ in the output of the first analog-to-digital converter 125A and the variation $\Delta_2$ in the output of the second analog-to-digital converter 125B is in a predetermined range. Specifically, the difference between the variation $\Delta_1$ in the output of the first analog-to-digital converter 125A and the variation $\Delta_2$ in the output of the second analog-to-digital converter 125B is compared to the threshold $\Delta_{th}$ determined in advance. In a case where the difference between the variation $\Delta_1$ in the output of the first analog-to-digital converter 125A and the variation $\Delta_2$ in the output of the second analog-to-digital converter 125B is higher than the threshold $\Delta_{th}$, that is, in a case of $|\Delta_1-\Delta_2|>\Delta_{th}$, Step 207 is performed. In a case where the difference between the variation $\Delta_1$ in the output of the first analog-to-digital converter 125A and the variation $\Delta_2$ in the output of the second analog-to-digital converter 125B is not higher than the threshold $\Delta_{th}$, that is, in a case of $|\Delta_1-\Delta_2|\leq\Delta_{th}$, Step 209 is performed.

As the threshold $\Delta_{th}$, for example, a potential difference (voltage) corresponding to a threshold current $I_{th}=0.01\cdot a\cdot I_{MAX}-I_{RES}$ expressed when it is assumed that the upper limit of the detection current of the current sensor 1 is $I_{MAX}$, required measurement accuracy is a %, and the resolution of the detection current of the current sensor 1 is $I_{RES}$ may be employed. In this case, when the full scale of the current sensor 1 is 1000 A, the required measurement accuracy is 1%, and the resolution of the current sensor 1 is 1 A, the potential difference corresponding to a threshold current of 9 A is employed as the threshold $\Delta_{th}$. In addition, the method of determining the threshold $\Delta_{th}$ is not particularly limited, and other determination methods may also be employed. In any case, it is preferable that an appropriate threshold $\Delta_{th}$ be used to determine presence and absence of noise.

In the case where the variation $\Delta_1$ in the output of the first analog-to-digital converter 125A and the variation $\Delta_2$ in the output of the second analog-to-digital converter 125B is higher than the threshold $\Delta_{th}$, that is, in the case of $|\Delta_1-\Delta_2|>\Delta_{th}$, noise of the output signals $O_{1-2}$ and $O_{2-2}$ obtained during the second sampling is determined to be high, and in Step 207, the output signals $O_{1-2}$ and $O_{2-2}$ obtained during the second sampling are discarded. In addition, the operation value in the first sampling output in Step 201 is treated as the operation value in the second sampling.

In the case where the variation $\Delta_1$ in the output of the first analog-to-digital converter 125A and the variation $\Delta_2$ in the output of the second analog-to-digital converter 125B is not higher than the threshold $\Delta_{th}$, that is, in the case of $|\Delta_1-\Delta_2|\leq\Delta_{th}$, noise of the output signals $O_{1-2}$ and $O_{2-2}$ obtained during the second sampling is determined to be low, and in Step 209, a differential value ($O_{1-2}-O_{2-2}$ or $O_{2-2}-O_{1-2}$) between the output signals $O_{1-2}$ and $O_{2-2}$ obtained during the second sampling is calculated. The differential value is treated as the operation value in the second sampling.

Thereafter, on the basis of the process in Step 207 or Step 209, the MCU 127 outputs the operation value in the second sampling in Step 211. The subsequent processes are the same and thus will be omitted.

Here, high or low noise is determined from the first sampling and the second sampling which are continuous, but the present invention is not limited to this. For example, in the above-described process flow, in the case where the noise of the output signals $O_{1-1}$ and $O_{1-2}$ obtained during the first sampling has already been determined to be high, variations are calculated from the output signals in the preceding sampling, and the same noise determination may be performed. For example, the preceding sampling of the first sampling is assumed to be zeroth sampling, and using an output signal $O_{1-0}$ of the first analog-to-digital converter 125A in the zeroth sampling and an output signal $O_{2-0}$ of the second analog-to-digital converter 125B in the zeroth sampling, a variation $\Delta_1 = O_{1-2} - O_{1-0}$ and a variation $\Delta_2 = O_{2-2} - O_{2-0}$ are calculated. High or low noise may be determined from the relationship between the variations and a threshold. The threshold in this case may be the same as the threshold $\Delta_{th}$ or may be different therefrom.

Otherwise, in the case where noise of the output signals $O_{1-1}$ and $O_{1-2}$ obtained during the first sampling is determined to be high, noise of the output signals $O_{1-2}$ and $O_{2-2}$ obtained during the second sampling is determined to be virtually low, and Step 209 may be performed.

In the correction process described above, the variation $\Delta_1$ in the output signal of the first analog-to-digital converter and the variation $\Delta_2$ in the output signal of the second analog-to-digital converter are compared to each other, and in the case where a deviation therebetween is high, it is assumed that the measurement accuracy is in a low state and the new measurement data is discarded. Accordingly, degradation in the measurement accuracy may be sufficiently suppressed. In addition, the correction process is not limited to the process illustrated in FIG. 2. Instead of the process illustrated in FIG. 2, another process may also be employed. In addition, as long as there is no contradiction, a combination with other processes described in a second embodiment and therebelow for use may be achieved.

Second Embodiment

Figure 3:
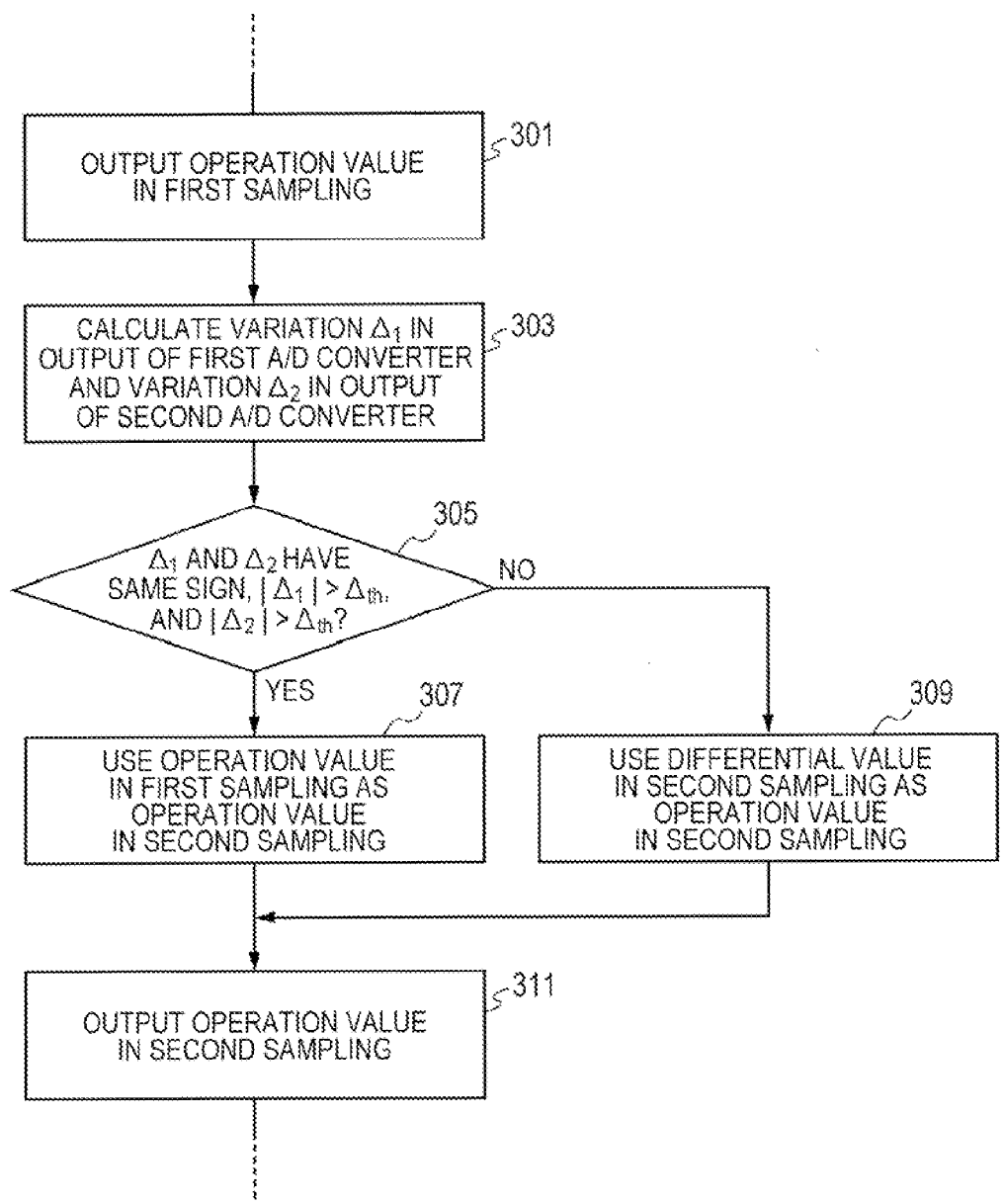
FIG. 3 is a diagram illustrating an example of the process flow in the operation device.

In this embodiment, an example of a correction process that is different from that in the first embodiment will be described. Here, (2) the above-mentioned correction process of, in a case where a variation $\Delta_1$ in the output of the first analog-to-digital converter 125A and a variation $\Delta_2$ in the output of the second analog-to-digital converter 125B have the same sign and each of the absolute value of $\Delta_1$ and the absolute value of $\Delta_2$ is greater than a threshold $\Delta_{th}$ determined in advance, discarding the measurement data and using data acquired at the preceding timing will be described in detail. FIG. 3 is a diagram illustrating an example of a process flow in the MCU 127 of the current sensor 1. In addition, in FIG. 3, for simplifying the description, only characteristic processes of the current sensor 1 of the present invention are illustrated.

Steps 301, 303, and 311 are the same as Steps 201, 203, and 211 in the first embodiment. That is, the MCU 127 outputs an operation value of the first sampling in Step 301, calculates a variation $\Delta_1$ in the output of the first analog-to-digital converter 125A and a variation $\Delta_2$ in the output of the second analog-to-digital converter 125B in Step 303, and outputs an operation of the second sampling on the basis of the process of Step 307 or 309 in Step 311.

In Step 305, in order to determine whether noise in the output signal of the first magnetic sensor 11A and the output signal of the second magnetic sensor 11B is high or low, it is determined whether or not the variation $\Delta_1$ in the output of the first analog-to-digital converter 125A and the variation $\Delta_2$ in the output of the second analog-to-digital converter 125B are in a predetermined range. Specifically, whether or not the signs of the variation $\Delta_1$ in the output of the first analog-to-digital converter 125A and the variation $\Delta_2$ in the output of the second analog-to-digital converter 125B are the same is evaluated, and each of the absolute value of the variation $\Delta_1$ in the output of the first analog-to-digital converter 125A and the absolute value of the variation $\Delta_2$ in the output of the second analog-to-digital converter 125B is compared to a threshold $\Delta_{th}$ determined in advance. In a case where the signs of the variation $\Delta_1$ in the output of the first analog-to-digital converter 125A and the variation $\Delta_2$ in the output of the second analog-to-digital converter 125B are the same, the absolute value of the variation $\Delta_1$ in the output of the first analog-to-digital converter 125A is higher than the threshold $\Delta_{th}$, and the absolute value of the variation $\Delta_2$ in the output of the second analog-to-digital converter 125B is higher than the threshold $\Delta_{th}$, that is, in a case of $\Delta_1 > 0$, $\Delta_2 > 0$, $|\Delta_1| > \Delta_{th}$, and $|\Delta_2| > \Delta_{th}$ or in a case of $\Delta_1 < 0$, $\Delta_2 < 0$, $|\Delta_1| > \Delta_{th}$, and $|\Delta_2| > \Delta_{th}$, Step 307 is performed. In a case where the signs of the variation $\Delta_1$ in the output of the first analog-to-digital converter 125A and the variation $\Delta_2$ in the output of the second analog-to-digital converter 125B are different, and in a case where the absolute value of the variation $\Delta_1$ in the output of the first analog-to-digital converter 125A is not higher than the threshold $\Delta_{th}$ or in a case the absolute value of the variation $\Delta_2$ in the output of the second analog-to-digital converter 125B is not higher than the threshold $\Delta_{th}$, that is, in a case of $\Delta_1 > 0$ and $\Delta_2 < 0$, or $\Delta_1 < 0$ and $\Delta_2 > 0$, and in a case of $|\Delta_1| \leq \Delta_{th}$ or $|\Delta_2| \leq \Delta_{th}$, Step 309 is performed.

A method of determining the threshold $\Delta_{th}$ is arbitrary. For example, the determination method described in the first embodiment may be used.

In a case where the absolute value of the variation $\Delta_1$ in the output of the first analog-to-digital converter 125A is higher than the threshold $\Delta_{th}$ and the absolute value of the variation $\Delta_2$ in the output of the second analog-to-digital converter 125B is higher than the threshold $\Delta_{th}$, that is, in a case of $|\Delta_1| > \Delta_{th}$ and $|\Delta_2| > \Delta_{th}$, noise of the output signals $O_{1-2}$ and $O_{2-2}$ obtained during the second sampling is determined to be high, and in Step 307, the output signals $O_{1-2}$ and $O_{2-2}$ obtained during the second sampling are discarded. In addition, the operation value in the first sampling output in Step 301 is treated as the operation value in the second sampling.

In a case where the absolute value of the variation $\Delta_1$ in the output of the first analog-to-digital converter 125A is not higher than the threshold $\Delta_{th}$ or in a case where the absolute value of the variation $\Delta_2$ in the output of the second analog-to-digital converter 125B is not higher than the threshold $\Delta_{th}$, that is, in a case of $|\Delta_1| \leq \Delta_{th}$ or $|\Delta_2| \leq \Delta_{th}$, noise of the output signals $O_{1-2}$ and $O_{2-2}$ obtained during the second sampling is determined to be low, and in Step 309, a differential value ($O_{1-2} - O_{2-2}$ or $O_{2-2} - O_{1-2}$) between the output signals $O_{1-2}$ and $O_{2-2}$ obtained during the second sampling is calculated and the differential value is treated as the operation value in the second sampling.

Here, high or low noise is determined from the first sampling and the second sampling which are continuous, but the present invention is not limited to this. For example, in the above-described process flow, in the case where the noise of the output signals $O_{1-1}$ and $O_{1-2}$ obtained during the first sampling has already been determined to be high, variations are calculated from the output signals in the preceding sampling, and the same noise determination may be performed. For example, the preceding sampling of the first sampling is assumed to be zeroth sampling, and using an output signal $O_{1-0}$ of the first analog-to-digital converter 125A in the zeroth sampling and an output signal $O_{2-0}$ of the second analog-to-digital converter 125B in the zeroth sampling, a variation $\Delta_1 = O_{1-2} - O_{1-0}$ and a variation $\Delta_2 = O_{2-2} - O_{2-0}$ are calculated. High or low noise may be determined from the relationship between the variations and a threshold. The threshold in this case may be the same as the threshold $\Delta_{th}$ or may be different therefrom.

Otherwise, in the case where noise of the output signals $O_{1-1}$ and $O_{1-2}$ obtained during the first sampling is determined to be high, noise of the output signals $O_{1-2}$ and $O_{2-2}$ obtained during the second sampling is determined to be virtually low, and Step 309 may be performed.

In the correction process described above, in a case where both the output signal of the first analog-to-digital converter and the output signal of the second analog-to-digital converter significantly change, it is assumed that the measurement accuracy is in a low state and the new measurement data is discarded. Accordingly, degradation in the measurement accuracy may be sufficiently suppressed. In addition, the correction process is not limited to the process illustrated in FIG. 3. Instead of the process illustrated in FIG. 3, another process may also be employed. In addition, as long as there is no contradiction, a combination with other processes for use may be achieved. For example, by combining the process illustrated in FIG. 2 with the process illustrated in FIG. 3 for use, it is possible to further suppress degradation in the measurement accuracy. In addition, in a case where a plurality of processes are combined, in order to prevent occurrence of contradiction, it is preferable that the priority of processes be determined in advance.

Third Embodiment

Figure 4:
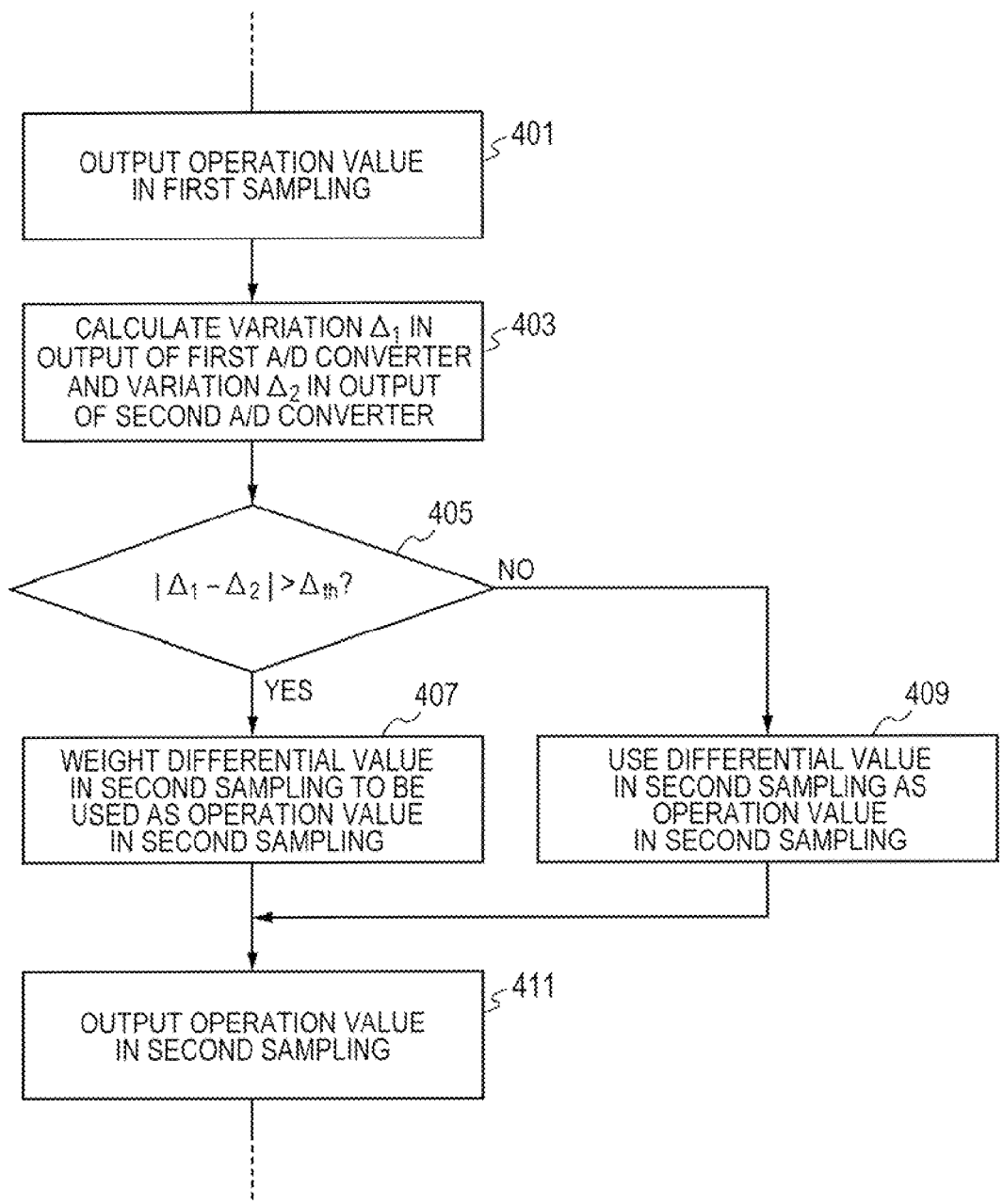
FIG. 4 is a diagram illustrating an example of the process flow in the operation device.

In this embodiment, an example of a correction process that is different from those in the first embodiment and the second embodiment will be described. Here, (3) the above-mentioned correction process of comparing a variation $\Delta_1$ in the output signal of the first analog-to-digital converter to a variation $\Delta_2$ in the output signal of the second analog-to-digital converter, and in a case where the difference therebetween is greater than a threshold $\Delta_{th}$, reducing the weighting of the measurement data will be described in detail. FIG. 4 is a diagram illustrating an example of a process flow in the MCU 127 of the current sensor 1. In addition, in FIG. 4, for simplifying the description, only characteristic processes of the current sensor 1 of the present invention are illustrated.

Steps 401, 403, and 411 are the same as Steps 201, 203, and 211 in the first embodiment. That is, the MCU 127 outputs an operation value of the first sampling in Step 401, calculates a variation $\Delta_1$ in the output of the first analog-to-digital converter 125A and a variation $\Delta_2$ in the output of the second analog-to-digital converter 125B in Step 403, and outputs an operation of the second sampling on the basis of the process of Step 407 or 409 in Step 411.

In addition, Step 405 is the same as Step 205 in the first embodiment. That is, in Step 405, the MCU 127 compares a difference between the variation $\Delta_1$ in the output of the first analog-to-digital converter 125A and the variation $\Delta_2$ in the output of the second analog-to-digital converter 125B to a threshold $\Delta_{th}$ determined in advance. In a case where the difference between the variation $\Delta_1$ in the output of the first analog-to-digital converter 125A and the variation $\Delta_2$ in the output of the second analog-to-digital converter 125B is higher than the threshold $\Delta_{th}$, that is, in a case of $|\Delta_1 - \Delta_2| > \Delta_{th}$, Step 407 is performed. In a case where the difference between the variation $\Delta_1$ in the output of the first analog-to-digital converter 125A and the variation $\Delta_2$ in the output of the second analog-to-digital converter 125B is not higher than the threshold $\Delta_{th}$, that is, in a case of $|\Delta_1 - \Delta_2| \leq \Delta_{th}$, Step 409 is performed.

A method of determining the threshold $\Delta_{th}$ is arbitrary. For example, the determination method described in the first embodiment may be used.

In a case where a difference between the variation $\Delta_1$ in the output of the first analog-to-digital converter 125A and the variation $\Delta_2$ in the output of the second analog-to-digital converter 125B is higher than a threshold $\Delta_{th}$, that is, in a case of $|\Delta_1 - \Delta_2| > \Delta_{th}$, noise of the output signals $O_{1-2}$ and $O_{2-2}$ obtained during the second sampling is determined to be high, and in Step 407, a differential value ($O_{1-2} - O_{2-2}$ or $O_{2-2} - O_{1-2}$) between the output signals $O_{1-2}$ and $O_{2-2}$ obtained during the second sampling is calculated, and the weighting thereof is set to be small for use. Specifically, for example, the sum of a value obtained by multiplying the differential value between the output signals $O_{1-2}$ and $O_{2-2}$ by a coefficient of c (c is less than 1) and a value obtained by multiplying the differential value ($O_{1-1} - O_{2-1}$ or $O_{2-1} - O_{1-1}$) between the output signals $O_{1-1}$ and $O_{2-1}$ obtained during the first sampling by a coefficient of $(1-c)$ is calculated, and the value calculated as such is treated as the operation value in the second sampling. In addition, a method of reducing the weighting of the differential value between the output signals $O_{1-2}$ and $O_{2-2}$ is not limited thereto.

In a case where a difference between the variation $\Delta_1$ in the output of the first analog-to-digital converter 125A and the variation $\Delta_2$ in the output of the second analog-to-digital converter 125B is not higher than a threshold $\Delta_{th}$, that is, in a case of $|\Delta_1 - \Delta_2| \leq \Delta_{th}$, noise of the output signals $O_{1-2}$ and $O_{2-2}$ obtained during the second sampling is determined to be low, and in Step 409, a differential value ($O_{1-2} - O_{2-2}$ or $O_{2-2} - O_{1-2}$) between the output signals $O_{1-2}$ and $O_{2-2}$ obtained during the second sampling is calculated and the differential value is treated as the operation value in the second sampling.

Here, high or low noise is determined from the first sampling and the second sampling which are continuous, but the present invention is not limited to this. For example, in the above-described process flow, in the case where the noise of the output signals $O_{1-1}$ and $O_{1-2}$ obtained during the first sampling has already been determined to be high, variations are calculated from the output signals in the preceding sampling, and the same noise determination may be performed. For example, the preceding sampling of the first sampling is assumed to be zeroth sampling, and using an output signal $O_{1-0}$ of the first analog-to-digital converter 125A in the zeroth sampling and an output signal $O_{2-0}$ of the second analog-to-digital converter 125B in the zeroth sampling, a variation $\Delta_1 = O_{1-2} - O_{1-0}$ and a variation $\Delta_2 = O_{2-2} - O_{2-0}$ are calculated. High or low noise may be determined from the relationship between the variations and a threshold. The threshold in this case may be the same as the threshold $\Delta_{th}$ or may be different therefrom.

In addition, in the case as described above, for example, the sum of a value obtained by multiplying the differential value between the output signals $O_{1-2}$ and $O_{2-2}$ by a coefficient of c (c is less than 1) and a value obtained by multiplying the differential value ($O_{1-0} - O_{2-0}$ or $O_{2-0} - O_{1-0}$) between the output signals $O_{1-0}$ and $O_{2-0}$ obtained during the zeroth sampling by a coefficient of $(1-c)$ is calculated, and the value calculated as such may be treated as the operation value in the second sampling. In addition, a value obtained by adding the differential values obtained during the zeroth sampling, the first sampling, and the second sampling at an appropriate ratio may also be treated as the operation value.

Otherwise, in the case where the noise of the output signals $O_{1-1}$ and $O_{1-2}$ obtained during the first sampling is determined to be high, noise of the output signals $O_{1-2}$ and $O_{2-2}$ obtained during the second sampling is determined to be virtually low, and Step 409 may be performed.

In the correction process described above, the variation in the output signal of the first analog-to-digital converter and the variation in the output signal of the second analog-to-digital converter are compared to each other, and in a case where a deviation therebetween is high, it is assumed that the measurement accuracy is in a low state and the weighting of the new measurement data is reduced. Accordingly, degradation in the measurement accuracy may be sufficiently suppressed. In addition, the correction process is not limited to the process illustrated in FIG. 4. Instead of the process illustrated in FIG. 4, another process may also be employed. In addition, as long as there is no contradiction, a combination with other processes for use may be achieved. For example, by combining the process illustrated in FIG. 3 with the process illustrated in FIG. 4 for use, it is possible to further suppress degradation in the measurement accuracy. In addition, in a case where a plurality of processes are combined, in order to prevent occurrence of contradiction, it is preferable that the priority of processes be determined in advance.

Fourth Embodiment

Figure 5:
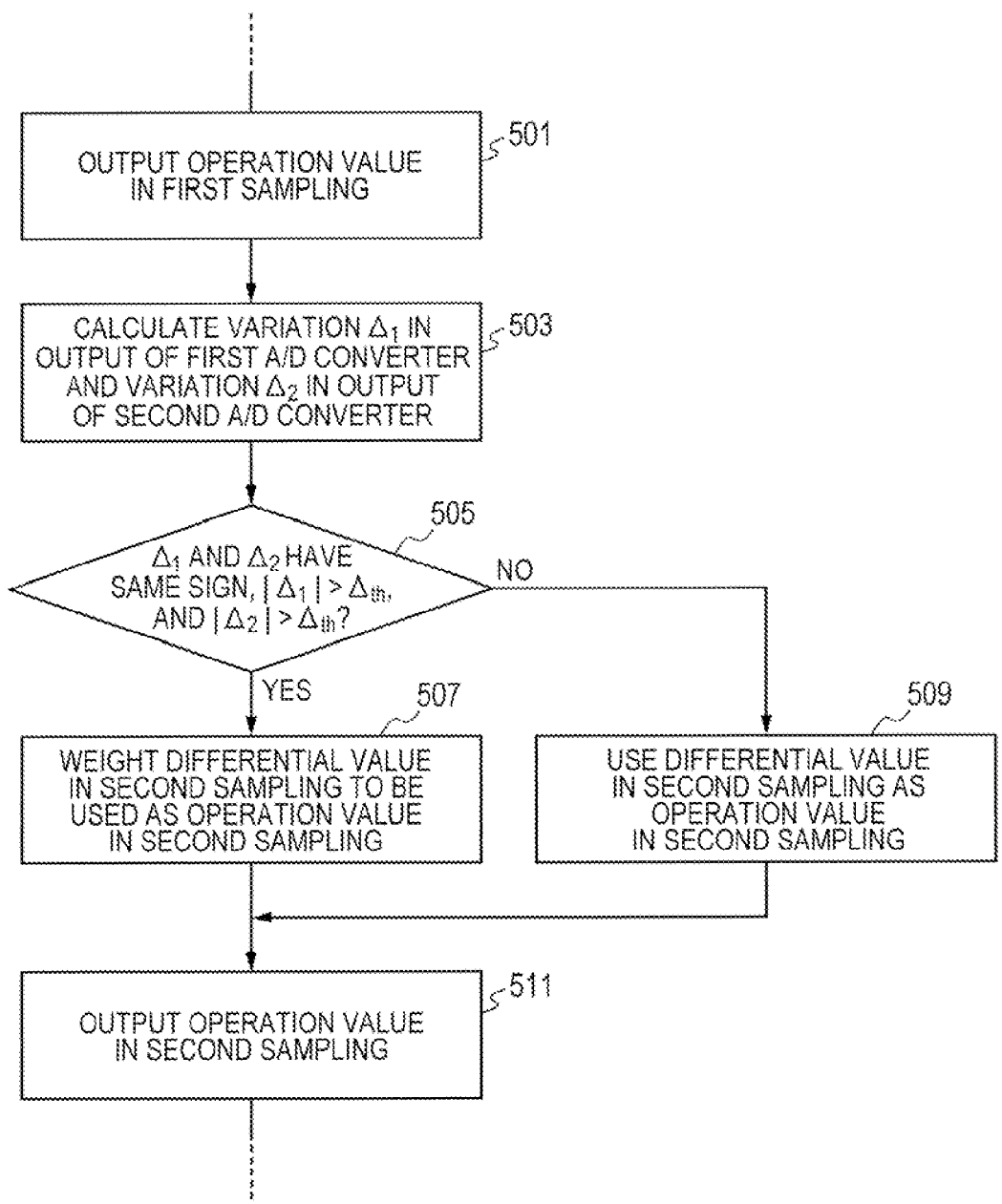
FIG. 5 is a diagram illustrating an example of the process flow in the operation device.

In this embodiment, an example of a correction process that is different from those in the first to third embodiments will be described. Here, (4) the above-mentioned correction process of, in a case where a variation $\Delta_1$ in the output of the first analog-to-digital converter 125A and a variation $\Delta_2$ in the output of the second analog-to-digital converter 125B have the same sign and each of the absolute value of $\Delta_1$ and the absolute value of $\Delta_2$ is greater than a threshold $\Delta_{th}$ determined in advance, reducing the weighting of the measurement data will be described in detail. FIG. 5 is a diagram illustrating an example of a process flow in the MCU 127 of the current sensor 1. In addition, in FIG. 5, for simplifying the description, only characteristic processes of the current sensor 1 of the present invention are illustrated.

Steps 501, 503, and 511 are the same as Steps 201, 203, and 211 in the first embodiment. That is, the MCU 127 outputs an operation value of the first sampling in Step 501, calculates a variation $\Delta_1$ in the output of the first analog-to-digital converter 125A and a variation $\Delta_2$ in the output of the second analog-to-digital converter 125B in Step 503, and outputs an operation of the second sampling on the basis of the process of Step 507 or 509 in Step 511.

In addition, Step 505 is the same as Step 305 in the second embodiment. That is, in Step 505, the MCU 127 evaluates whether or not the variation $\Delta_1$ in the output of the first analog-to-digital converter 125A and the variation $\Delta_2$ in the output of the second analog-to-digital converter 125B have the same sign, and compares each of the absolute value of the variation $\Delta_1$ in the output of the first analog-to-digital converter 125A and the absolute value of the variation $\Delta_2$ in the output of the second analog-to-digital converter 125B to a threshold $\Delta_{th}$ determined in advance. In a case where the variation $\Delta_1$ in the output of the first analog-to-digital converter 125A and the variation $\Delta_2$ in the output of the second analog-to-digital converter 125B have the same sign, the absolute value of the variation $\Delta_1$ in the output of the first analog-to-digital converter 125A is higher than the threshold $\Delta_{th}$, and the absolute value of the variation $\Delta_2$ in the output of the second analog-to-digital 125B is higher than the threshold $\Delta_{th}$, that is, in a case of $\Delta_1>0$, $\Delta_2>0$, $|\Delta_1|>\Delta_{th}$, and $|\Delta_2|>\Delta_{th}$, or in a case of $\Delta_1<0$, $\Delta_2<0$, $|\Delta_1|>\Delta_{th}$, and $|\Delta_2|>\Delta_{th}$, Step 507 is performed. In a case where the signs of the variation $\Delta_1$ in the output of the first analog-to-digital converter 125A and the variation $\Delta_2$ in the output of the second analog-to-digital converter 125B are different, and in a case where the absolute value of the variation $\Delta_1$ in the output of the first analog-to-digital converter 125A is not higher than the threshold $\Delta_{th}$, or in a case the absolute value of the variation $\Delta_2$ in the output of the second analog-to-digital converter 125B is not higher than the threshold $\Delta_{th}$, that is, in a case of $\Delta_1>0$ and $\Delta_2<0$, or $\Delta_1<0$ and $\Delta_2>0$, and in a case of $|\Delta_1|\leq\Delta_{th}$ or $|\Delta_2|\leq\Delta_{th}$, Step 509 is performed.

A method of determining the threshold $\Delta_{th}$ is arbitrary. For example, the determination method described in the first embodiment may be used.

In a case where the absolute value of the variation $\Delta_1$ in the output of the first analog-to-digital converter 125A is higher than the threshold $\Delta_{th}$ and the absolute value of the variation $\Delta_2$ in the output of the second analog-to-digital converter 125B is higher than the threshold $\Delta_{th}$, that is, in a case of $|\Delta_1|>\Delta_{th}$ and $|\Delta_2|>\Delta_{th}$, noise of the output signals $O_{1-2}$ and $O_{2-2}$ obtained during the second sampling is determined to be high, and in Step 507, a differential value ($O_{1-2}-O_{2-2}$ or $O_{2-2}-O_{1-2}$) between the output signals $O_{1-2}$ and $O_{2-2}$ obtained during the second sampling is calculated, and the weighting thereof is set to be small for use. Specifically, for example, the sum of a value obtained by multiplying the differential value between the output signals $O_{1-2}$ and $O_{2-2}$ by a coefficient of c (c is less than 1) and a value obtained by multiplying the differential value ($O_{1-1}-O_{2-1}$ or $O_{2-1}-O_{1-1}$) between the output signals $O_{1-1}$ and $O_{2-1}$ obtained during the first sampling by a coefficient of (1−c) is calculated, and the value calculated as such is treated as the operation value in the second sampling. In addition, a method of reducing the weighting of the differential value between the output signals $O_{1-2}$ and $O_{2-2}$ is not limited thereto.

In a case where the absolute value of the variation $\Delta_1$ in the output of the first analog-to-digital converter 125A is not higher than the threshold $\Delta_{th}$ or in a case where the absolute value of the variation $\Delta_2$ in the output of the second analog-to-digital converter 125B is not higher than the threshold $\Delta_{th}$, that is, in a case of $|\Delta_1|\leq\Delta_{th}$ or $\Delta_2|\leq\Delta_{th}$, noise of the output signals $O_{1-2}$ and $O_{2-2}$ obtained during the second sampling is determined to be low, and in Step 509, a differential value ($O_{1-2}-O_{2-2}$ or $O_{2-2}-O_{1-2}$) between the output signals $O_{1-2}$ and $O_{2-2}$ obtained during the second sampling is calculated and the differential value is treated as the operation value in the second sampling.

Here, high or low noise is determined from the first sampling and the second sampling which are continuous, but the present invention is not limited to this. For example, in the above-described process flow, in the case where the noise of the output signals $O_{1-1}$ and $O_{1-2}$ obtained during the first sampling has already been determined to be high, variations are calculated from the output signals in the preceding sampling, and the same noise determination may be performed. For example, the preceding sampling of the first sampling is assumed to be zeroth sampling, and using an output signal $O_{1-0}$ of the first analog-to-digital converter 125A in the zeroth sampling and an output signal $O_{2-0}$ of the second analog-to-digital converter 125B in the zeroth sampling, a variation $\Delta_1=O_{1-2}-O_{1-0}$ and a variation $\Delta_2=O_{2-2}-O_{2-0}$ are calculated. High or low noise may be determined from the relationship between the variations and a threshold. The threshold in this case may be the same as the threshold $\Delta_{th}$ or may be different therefrom.

In addition, in the case as described above, for example, the sum of a value obtained by multiplying the differential value between the output signals $O_{1-2}$ and $O_{2-2}$ by a coefficient of c (c is less than 1) and a value obtained by multiplying the differential value ($O_{1-0}$–$O_{2-0}$ or $O_{2-0}$–$O_{1-0}$) between the output signals $O_{1-0}$ and $O_{2-0}$ obtained during the zeroth sampling by a coefficient of (1–c) is calculated, and the value calculated as such may be treated as the operation value in the second sampling. In addition, a value obtained by adding the differential values obtained during the zeroth sampling, the first sampling, and the second sampling at an appropriate ratio may also be treated as the operation value.

Otherwise, in the case where the noise of the output signals $O_{1-1}$ and $O_{1-2}$ obtained during the first sampling is determined to be high, noise of the output signals $O_{1-2}$ and $O_{2-2}$ obtained during the second sampling is determined to be virtually low, and Step 509 may be performed.

In the correction process described above, in a case where both the output signal of the first analog-to-digital converter and the output signal of the second analog-to-digital converter significantly change, it is assumed that the measurement accuracy is in a low state and the weighting of the new measurement data is reduced. Accordingly, degradation in the measurement accuracy may be sufficiently suppressed. In addition, the correction process is not limited to the process illustrated in FIG. 5. Instead of the process illustrated in FIG. 5, another process may also be employed. In addition, as long as there is no contradiction, a combination with other processes for use may be achieved. For example, by combining the process illustrated in FIG. 4 (or FIG. 1) with the process illustrated in FIG. 5 for use, it is possible to further suppress degradation in the measurement accuracy. In addition, in a case where a plurality of processes are combined, in order to prevent occurrence of contradiction, it is preferable that the priority of processes be determined in advance.

Fifth Embodiment

Figure 6:
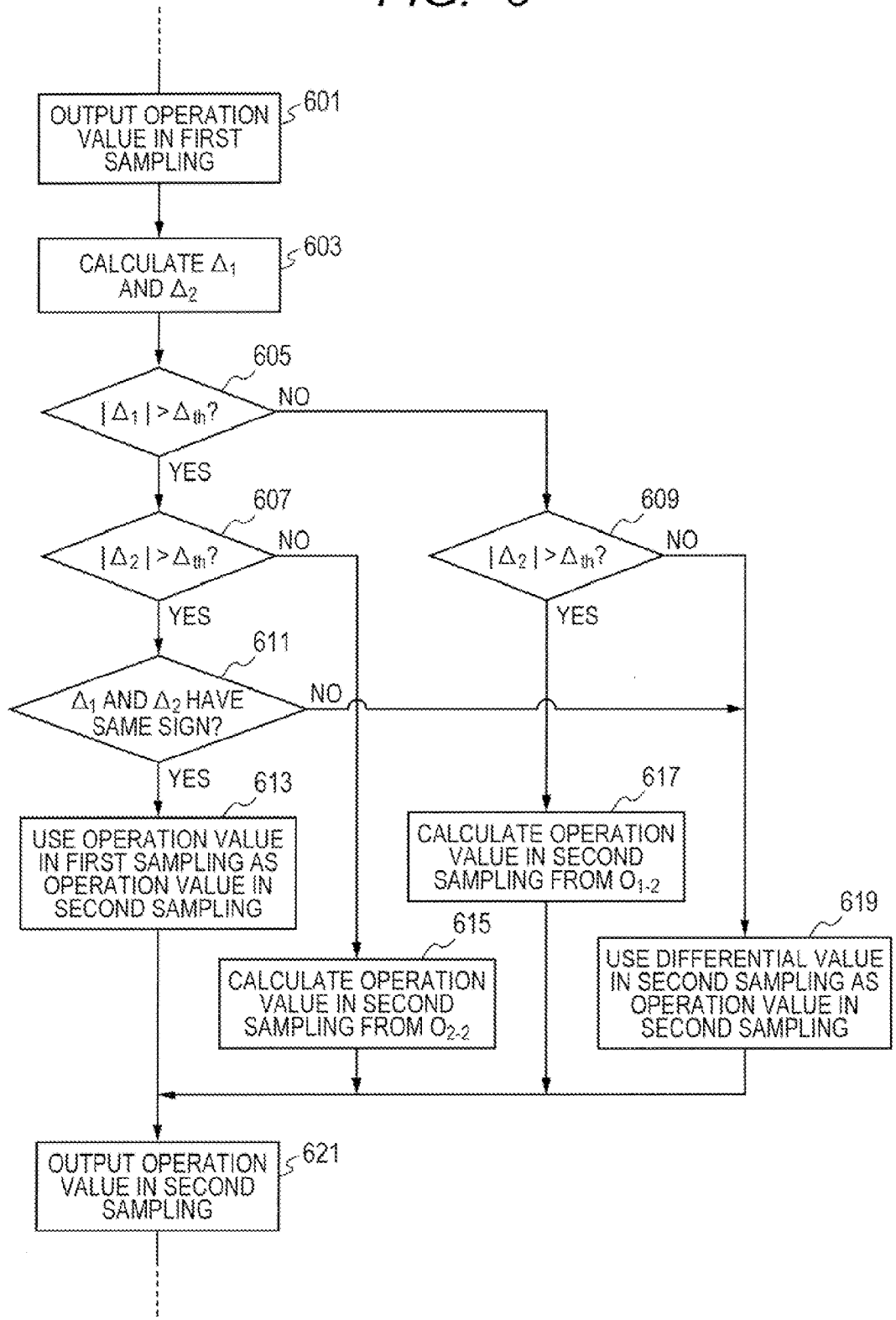
FIG. 6 is a diagram illustrating an example of the process flow in the operation device.

In this embodiment, an example of a correction process that is different from those in the first to fourth embodiments will be described. Here, (5) the above-mentioned correction process of, in a case where any one of the absolute value of a variation $\Delta_1$ in the output of the first analog-to-digital converter 125A and the absolute value of a variation $\Delta_2$ in the output of the second analog-to-digital converter 125B is greater than a threshold $\Delta_{th}$ determined in advance, discarding the one value of measurement data will be described in detail. FIG. 6 is a diagram illustrating an example of a process flow in the MCU 127 of the current sensor 1. In addition, in FIG. 6, for simplifying the description, only characteristic processes of the current sensor 1 of the present invention are illustrated.

Steps 601 and 603 are the same as Steps 201 and 203 in the first embodiment. That is, the MCU 127 outputs an operation value of the first sampling in Step 601, and calculates a variation $\Delta_1$ in the output of the first analog-to-digital converter 125A and a variation $\Delta_2$ in the output of the second analog-to-digital converter 125B in Step 603.

In Steps 605, 607, 609, and 611, in order to determine whether noise in the output signal of the first magnetic sensor 11A and the output signal of the second magnetic sensor 11B is high or low, it is determined whether or not the variation $\Delta_1$ in the output of the first analog-to-digital converter 125A and the variation $\Delta_2$ in the output of the second analog-to-digital converter 125B are in a predetermined range. Specifically, the absolute value of the variation $\Delta_1$ in the output of the first analog-to-digital converter 125A is compared to a threshold $\Delta_{th}$ in Step 605, the absolute value of the variation $\Delta_2$ in the output of the second analog-to-digital converter 125B is compared to the threshold $\Delta_{th}$ determined in advance in Steps 607 and 609, and whether or not the signs of the variation $\Delta_1$ in the output of the first analog-to-digital converter 125A and the variation $\Delta_2$ in the output of the second analog-to-digital converter 125B are the same is evaluated in Step 611.

A method of determining the threshold $\Delta_{th}$ is arbitrary. For example, the determination method described in the first embodiment may be used.

In a case where the variation $\Delta_1$ in the output of the first analog-to-digital converter 125A and the variation $\Delta_2$ in the output of the second analog-to-digital converter 125B have the same sign, the absolute value of the variation $\Delta_1$ in the output of the first analog-to-digital converter 125A is higher than the threshold $\Delta_{th}$, and the absolute value of the variation $\Delta_2$ in the output of the second analog-to-digital 125B is higher than the threshold $\Delta_{th}$, that is, in a case of $\Delta_1>0$, $\Delta_2>0$, $|\Delta_1|>\Delta_{th}$, and $\Delta_2|>\Delta_{th}$, or in a case of $\Delta_1<0$, $\Delta_2<0$, $|\Delta_1|>\Delta_{th}$, and $\Delta_2|>\Delta_{th}$, Step 613 is performed. In a case where the absolute value of the variation $\Delta_1$ in the output of the first analog-to-digital converter 125A is higher than the threshold $\Delta_{th}$ and the absolute value of the variation $\Delta_2$ in the output of the second analog-to-digital 125B is not higher than the threshold $\Delta_{th}$, that is, in a case of $|\Delta_1|>\Delta_{th}$ and $|\Delta_2|\leq\Delta_{th}$, Step 615 is performed. In a case where the absolute value of the variation $\Delta_1$ in the output of the first analog-to-digital converter 125A is not higher than the threshold $\Delta_{th}$ and the absolute value of the variation $\Delta_2$ in the output of the second analog-to-digital 125B is higher than the threshold $\Delta_{th}$, that is, in a case of $|\Delta_1|\leq\Delta_{th}$ and $\Delta_2|>\Delta_{th}$, Step 617 is performed. In a case where the absolute value of the variation $\Delta_1$ in the output of the first analog-to-digital converter 125A is not higher than the threshold $\Delta_{th}$ and the absolute value of the variation $\Delta_2$ in the output of the second analog-to-digital 125B is not higher than the threshold $\Delta_{th}$, that is, in a case of $|\Delta_1|\leq\Delta_{th}$ and $\Delta_2|\leq\Delta_{th}$, or in a case where the signs of the variation $\Delta_1$ in the output of the first analog-to-digital converter 125A and the variation $\Delta_2$ in the output of the second analog-to-digital converter 125B are different, the absolute value of the variation $\Delta_1$ in the output of the first analog-to-digital converter 125A is higher than the threshold $\Delta_{th}$, and the absolute value of the variation $\Delta_2$ in the output of the second analog-to-digital 125B is higher than the threshold $\Delta_{th}$, that is, in a case of $\Delta_1>0$, $\Delta_2<0$, $|\Delta_1|>\Delta_{th}$, and $\Delta_2|>\Delta_{th}$, or in a case of $\Delta_1<0$, $\Delta_2>0$, $|\Delta_1|>\Delta_{th}$, and $\Delta_2|>\Delta_{th}$, Step 619 is performed.

In a case where the signs of the variation $\Delta_1$ in the output of the first analog-to-digital converter 125A and the variation $\Delta_2$ in the output of the second analog-to-digital converter 125B are the same, the absolute value of the variation $\Delta_1$ in the output of the first analog-to-digital converter 125A is higher than the threshold $\Delta_{th}$, and the absolute value of the variation $\Delta_2$ in the output of the second analog-to-digital 125B is higher than the threshold $\Delta_{th}$, that is, in a case of $\Delta_1>0$, $\Delta_2>0$, $|\Delta_1|>\Delta_{th}$, and $\Delta_2|>\Delta_{th}$ or in a case of $\Delta_1<0$, $\Delta_2<0$, $|\Delta_1|>\Delta_{th}$, and $\Delta_2|>\Delta_{th}$, noise of the output signal $O_{1-2}$ obtained during the second sampling is determined to be high, noise of the output signal $O_{2-2}$ obtained during the second sampling is determined to be high, the output signals $O_{1-2}$ and $O_{2-2}$ obtained during the second sampling are discarded in Step 613, and the operation value in the first sampling output in Step 601 is treated as the operation value in the second sampling.

In a case where the absolute value of the variation $\Delta_1$ in the output of the first analog-to-digital converter 125A is higher than the threshold $\Delta_{th}$ and the absolute value of the variation $\Delta_2$ in the output of the second analog-to-digital 125B is not higher than the threshold $\Delta_{th}$, that is, in a case of $|\Delta_1|>\Delta_{th}$ and $|\Delta_2|\leq\Delta_{th}$, noise of the output signal $O_{1-2}$ obtained during the second sampling is determined to be high, noise of the output signal $O_{2-2}$ obtained during the second sampling is determined to be low, and the operation value in the second sampling is calculated from the variation $\Delta_2$ of the output signal $O_{2-2}$ in Step 615. Specifically, for example, a value obtained by adding two times the variation $\Delta_2$ to the operation value in the first sampling is treated as the operation value. Here, in a case of a relationship in which the variation $\Delta_2$ reduces with an increase in the current to be measured, the sign of the variation $\Delta_2$ is reversed (positive and negative are switched) to calculate the operation value. In addition, a method of calculating the operation value is not limited thereto.

In a case where the absolute value of the variation $\Delta_1$ in the output of the first analog-to-digital converter 125A is not higher than the threshold $\Delta_{th}$ and the absolute value of the variation $\Delta_2$ in the output of the second analog-to-digital 125B is higher than the threshold $\Delta_{th}$, that is, in a case of $|\Delta_1|\leq\Delta_{th}$ and $\Delta_2|>\Delta_{th}$, noise of the output signal $O_{1-2}$ obtained during the second sampling is determined to be low, noise of the output signal $O_{2-2}$ obtained during the second sampling is determined to be high, and the operation value in the second sampling is calculated from the variation $\Delta_1$ of the output signal $O_{1-2}$ in Step 617. Specifically, for example, a value obtained by adding two times the variation $\Delta_1$ to the operation value in the first sampling is treated as the operation value. Here, in a case of a relationship in which the variation $\Delta_1$ reduces with an increase in the current to be measured, the sign of the variation $\Delta_1$ is reversed (positive and negative are switched) to calculate the operation value. In addition, a method of calculating the operation value is not limited thereto.

In a case where the absolute value of the variation $\Delta_1$ in the output of the first analog-to-digital converter 125A is not higher than the threshold $\Delta_{th}$ and the absolute value of the variation $\Delta_2$ in the output of the second analog-to-digital 125B is not higher than the threshold $\Delta_{th}$, that is, in a case of $|\Delta_1|<\Delta_{th}$ and $\Delta_2|\leq\Delta_{th}$, noise of the output signal $O_{1-2}$ obtained during the second sampling is determined to be low, noise of the output signal $O_{2-2}$ obtained during the second sampling is determined to be low, a differential value ($O_{1-2}-O_{2-2}$ or $O_{2-2}-O_{1-2}$) between the output signals $O_{1-2}$ and $O_{2-2}$ obtained during the second sampling is calculated in Step 619, and the differential value is treated as the operation value in the second sampling. In addition, in a case where signs of the variation $\Delta_1$ in the output of the first analog-to-digital converter 125A and the variation $\Delta_2$ in the output of the second analog-to-digital converter 125B are different, the absolute value of the variation $\Delta_1$ in the output of the first analog-to-digital converter 125A is higher than the threshold $\Delta_{th}$, and the absolute value of the variation $\Delta_2$ in the output of the second analog-to-digital 125B is higher than the threshold $\Delta_{th}$, that is, in a case of $\Delta_1>0$, $\Delta_2<0$, $|\Delta_1|>\Delta_{th}$, and $|\Delta_2|>\Delta_{th}$ or in a case of $\Delta_1<0$, $\Delta_2>0$, $|\Delta_1|>\Delta_{th}$, or $|\Delta_2|>\Delta_{th}$, the differential value ($O_{1-2}-O_{2-2}$ or $O_{2-2}-O_{1-2}$) between the output signals $O_{1-2}$ and $O_{2-2}$ obtained during the second sampling is calculated in Step 619, and the differential value is treated as the operation value in the second sampling.

Here, high or low noise is determined from the first sampling and the second sampling which are continuous, but the present invention is not limited to this. For example, in the above-described process flow, in the case where the noise of the output signals $O_{1-1}$ and $O_{1-2}$ obtained during the first sampling has already been determined to be high, variations are calculated from the output signals in the preceding sampling, and the same noise determination may be performed. For example, the preceding sampling of the first sampling is assumed to be zeroth sampling, and using an output signal $O_{1-0}$ of the first analog-to-digital converter 125A in the zeroth sampling and an output signal $O_{2-0}$ of the second analog-to-digital converter 125B in the zeroth sampling, a variation $\Delta_1=O_{1-2}-O_{1-0}$ and a variation $\Delta_2=O_{2-2}-O_{2-0}$ are calculated. High or low noise may be determined from the relationship between the variations and a threshold. The threshold in this case may be the same as the threshold $\Delta_{th}$ or may be different therefrom.

Otherwise, in the case where noise of the output signals $O_{1-1}$ and $O_{1-2}$ obtained during the first sampling is determined to be high, noise of the output signals $O_{1-2}$ and $O_{2-2}$ obtained during the second sampling is determined to be virtually low, and Step 617 may be performed.

Thereafter, the MCU 127 calculates the operation value in the second sampling in Step 621 on the basis of the processes of Steps 613, 615, 617, and 619. The subsequent processes are the same and thus will be omitted.

In the correction process described above, in a case where both the output signal of the first analog-to-digital converter and the output signal of the second analog-to-digital converter significantly change, it is assumed that the measurement accuracy is in a low state and the new measurement data is discarded. Accordingly, degradation in the measurement accuracy may be sufficiently suppressed. In this case, the weighting of the new measurement data may be reduced. In addition, in a case where only one of the output signal of the first analog-to-digital converter and the output signal of the second analog-to-digital converter significantly changes, it is assumed that the measurement accuracy of the other output signal is in a high state and only the other output signal is used. Accordingly, in a situation of high noise, measurement may be performed with high accuracy. In addition, even in a situation in which a sampling period is longer than a time of current change such that discarding sampling data becomes a factor of significant degradation in measurement accuracy, measurement may be performed with high accuracy. In addition, the correction process is not limited to the process illustrated in FIG. 6. Instead of the process illustrated in FIG. 6, another process may also be employed. In addition, as long as there is no contradiction, a combination with other processes for use may be achieved.

Sixth Embodiment

In this embodiment, a process of outputting a signal (hereinafter, an error signal) indicating an error status in a case where noise is determined to be high in the first to fifth embodiments and the like will be described. A status in which noise is determined to be high during sampling occurs due to occurrence of some error in the current sensor 1, a system including this, or the like, occurrence of errors, or the like. Therefore, outputting a signal indicating this status is effective in terms of fail safe.

First, in the processes described in the first to fifth embodiments and the like, high or low noise in the output signal of the first magnetic sensor 11A and the output signal of the second magnetic sensor 11B is determined (Steps 205, 305, 405, 505, 605, 607, 609, 611, and the like). For example, in the process of the first embodiment, in Step 205, the difference between the variation $\Delta_1$ in the output of the first analog-to-digital converter 125A and the variation $\Delta_2$ in the output of the second analog-to-digital converter 125B is compared to the threshold $\Delta_{th}$ determined in advance.

In the above-described process, in a case where noise is determined to be high, in addition to the correction process or instead of the correction process, a process of outputting an error signal is performed. For example, in the process of the first embodiment, in a case where the process of outputting the error signal in addition to the correction process are performed, in Step 207, the operation value in the first sampling is used as the operation value in the second sampling, and in Step 211, the operation value in the second sampling and the error signal are output. In addition, the process of outputting the error signal may be associated with the correction process or may be independent from the correction process. For example, a configuration in which the error signal is output when the correction process is completed as described above and an operation signal is output during sampling may be employed. In addition, a configuration in which only the error signal is output without performing the correction process when noise is determined to be high may also be employed.

In the above-described process, in the case where noise of the output signal from the magnetic sensor (the output signal of the analog-to-digital converter) is determined to be high, the MCU 127 outputs the error signal. As the system including the current sensor 1 uses the error signal, operation error in the system including the current sensor 1 may be prevented. In addition, maintenance and inspection of the current sensor 1, the system including this, and the like are facilitated. For example, it is possible to detect the failure of the current sensor 1 and the like early. That is, in the current sensor 1 that employs the above-described process, an object to facilitate maintenance of a system to prevent malfunction of the system including the current sensor 1 may be accomplished.

In addition, the present invention is not limited to the embodiments, and various modifications can be made. For example, connection relationships and sizes of the elements in the embodiment may be appropriately changed. In addition, various processes may be combined for use. Besides, the present invention may be appropriately modified without departing from the scope of the present invention.

It is possible to use the current sensor of the present invention to detect the magnitude of current for driving the motor of, for example, an electric vehicle or a hybrid vehicle.

It should be understood by those skilled in the art that various modifications, combinations, sub-combinations and alterations may occur depending on design requirements and other factors insofar as they are within the scope of the appended claims of the equivalents thereof.

What is claimed is:

1. A current sensor comprising:
   a first magnetic sensor and a second magnetic sensor arranged in a periphery of a current line through which a current to be measured flows, the first and second magnetic sensors outputting first and second output signals, respectively, due to an induction magnetic field applied thereto from the current to be measured, the first and second output signals having respective phases opposite to each other;
   a first analog-to-digital converter connected to the first magnetic sensor, configured to convert the first output signal and output a first digital signal;
   a second analog-to-digital converter connected to the second magnetic sensor, configured to convert the second output signal and output a second digital signal; and
   an operation device connected to the first and second analog-to-digital converters, configured to output an operation value by subjecting the first and second digital signals to an differential operation,
   wherein the operation device determines that measurement accuracy is low if a difference between a first variation $\Delta_1$ in the first digital signal and a second variation $\Delta_2$ in the second digital is greater than a threshold $\Delta_{th}$, the first variation $\Delta_1$ being an amount of change from the first digital signal $O_{1-1}$ obtained during a first sampling in the first digital signal $O_{1-2}$ obtained during a second sampling immediately after the first sampling, and the second variation $\Delta_2$ being an amount of change from the second digital signal $O_{2-1}$ obtained during the first sampling in the second digital signal obtained during the second sampling.

2. The current sensor according to claim 1,
   wherein, if the operation device determines that the measurement accuracy is low, the operation device outputs the operation value in the first sampling as the operation value for the second sampling.

3. The current sensor according to claim 1,
   wherein, if the operation device determines that the measurement accuracy is low, an error signal is output.

4. The current sensor according to claim 1,
   wherein, if the operation device determines that the measurement accuracy is low, the operation device outputs, as the operation value for the second sampling, a value obtained by multiplying a differential value between the first digital signal $O_{1-2}$ and the second digital signal $O_{2-2}$ during the second sampling by a coefficient of less than 1.

5. The current sensor according to claim 1,
   wherein the first magnetic sensor and the second magnetic sensor are arranged in a point-symmetrical manner with respect to the current line as a center such that the first and second magnetic sensor have a same sensing axis direction.

6. The current sensor according to claim 1,
   wherein the first magnetic sensor and the second magnetic sensor are magnetic balance type sensors each including:
   a magnetic sensor element having characteristics being capable of changing due to the induction magnetic field applied thereto from the current to be measured; and
   a feedback coil configured to generate a cancellation magnetic field that cancels the induction magnetic field.

7. The current sensor according to claim 6,
   wherein the magnetic sensor element is a magnetoresistance element.

8. A current sensor comprising:
   a first magnetic sensor and a second magnetic sensor arranged in a periphery of a current line through which a current to be measured flows, the first and second magnetic sensors outputting first and second output signals, respectively, due to an induction magnetic field applied thereto from the current to be measured, the first and second output signals having respective phases opposite to each other;
   a first analog-to-digital converter connected to the first magnetic sensor, configured to convert the first output signal and output a first digital signal;
   a second analog-to-digital converter connected to the second magnetic sensor, configured to convert the second output signal and output a second digital signal; and
   an operation device connected to the first and second analog-to-digital converters, configured to output an operation value by subjecting the first and second digital signals to an differential operation, wherein the operation device determines that measurement accuracy is low, if a variation $\Delta_1$ between the first digital signal $O_{1\text{-}1}$ obtained during a first sampling and the first digital signal $O_{1\text{-}2}$ obtained during a second sampling immediately after the first sampling is greater than a threshold $\Delta_{th}$, and a variation $\Delta_2$ between the second digital signal $O_{2\text{-}1}$ obtained during the first sampling and the second digital signal $O_{2\text{-}2}$ obtained during the second sampling is greater than the threshold $\Delta_{th}$.

9. The current sensor according to claim 8, wherein, if the operation device determines that the measurement accuracy is low, the operation device outputs the operation value in the first sampling as the operation value for the second sampling.

10. The current sensor according to claim 8, wherein, if the operation device determines that the measurement accuracy is low, an error signal is output.

11. The current sensor according to claim 8, wherein, if the operation device determines that the measurement accuracy is low, the operation device outputs, as the operation value for the second sampling, a value obtained by multiplying a differential value between the first digital signal $O_{1\text{-}2}$ and the second digital signal $O_{2\text{-}2}$ during the second sampling by a coefficient of less than 1.

12. The current sensor according to claim 8, wherein the first magnetic sensor and the second magnetic sensor are arranged in a point-symmetrical manner with respect to the current line as a center such that the first and second magnetic sensor have a same sensing axis direction.

13. The current sensor according to claim 8, wherein the first magnetic sensor and the second magnetic sensor are magnetic balance type sensors each including:
   a magnetic sensor element having characteristics being capable of changing due to the induction magnetic field applied thereto from the current to be measured; and
   a feedback coil configured to generate a cancellation magnetic field that cancels the induction magnetic field.

14. The current sensor according to claim 13, wherein the magnetic sensor element is a magnetoresistance element.

15. A current sensor comprising:
a first magnetic sensor and a second magnetic sensor arranged in a periphery of a current line through which a current to be measured flows, the first and second magnetic sensors outputting first and second output signals, respectively, due to an induction magnetic field applied thereto from the current to be measured, the first and second output signals having respective phases opposite to each other;
a first analog-to-digital converter connected to the first magnetic sensor, configured to convert the first output signal and output a first digital signal;
a second analog-to-digital converter connected to the second magnetic sensor, configured to convert the second output signal and output a second digital signal; and
an operation device connected to the first and second analog-to-digital converters, configured to output an operation value by subjecting the first and second digital signals to an differential operation,
wherein the operation device outputs, if a first variation $\Delta_1$ between the first digital signal $O_{1\text{-}1}$ obtained during a first sampling and the first digital signal $O_{1\text{-}2}$ obtained during a second sampling immediately after the first sampling is greater than a threshold $\Delta_{th}$, and a second variation $\Delta_2$ between the second digital signal $O_{2\text{-}1}$ obtained during the first sampling and the second digital signal $O_{2\text{-}2}$ obtained during the second sampling is not greater than the threshold $\Delta_{th}$, a value calculated from the second digital signal $O_{2\text{-}2}$ obtained during the second sampling as the operation value for the second sampling, and
wherein the operation device outputs, if the first variation $\Delta_1$ is not greater than the threshold $\Delta_{th}$ and the second variation $\Delta_2$ is greater than the threshold $\Delta_{th}$, a value calculated from the first digital signal $O_{1\text{-}2}$ during the second sampling as an operation value for the second sampling.

16. The current sensor according to claim 15, wherein the first magnetic sensor and the second magnetic sensor are arranged in a point-symmetrical manner with respect to the current line as a center such that the first and second magnetic sensor have a same sensing axis direction.

17. The current sensor according to claim 15, wherein the first magnetic sensor and the second magnetic sensor are magnetic balance type sensors each including:
   a magnetic sensor element having characteristics being capable of changing due to the induction magnetic field applied thereto from the current to be measured; and
   a feedback coil configured to generate a cancellation magnetic field that cancels the induction magnetic field.

18. The current sensor according to claim 17, wherein the magnetic sensor element is a magnetoresistance element.

* * * * *